United States Patent
Adenot-Engelvin et al.

(10) Patent No.: US 7,369,025 B2
(45) Date of Patent: May 6, 2008

(54) ELECTRONIC DEVICE PROVIDED WITH A MAGNETIC SCREENING

(75) Inventors: Anne Lise Adenot-Engelvin, Tours (FR); Olivier Reynet, Chambray les Tours (FR); Olivier Acher, Monts (FR)

(73) Assignee: Commissariat a l'Energie Atomique, Paris (FR)

( * ) Notice: Subject to any disclaimer, the term of this patent is extended or adjusted under 35 U.S.C. 154(b) by 303 days.

(21) Appl. No.: 10/528,177

(22) PCT Filed: Jul. 6, 2004

(86) PCT No.: PCT/FR2004/050313

§ 371 (c)(1),
(2), (4) Date: Mar. 17, 2005

(87) PCT Pub. No.: WO2005/006828

PCT Pub. Date: Jan. 20, 2005

(65) Prior Publication Data

US 2006/0049909 A1     Mar. 9, 2006

(30) Foreign Application Priority Data

Jul. 8, 2003     (FR) .................................. 03 50305

(51) Int. Cl.
*H01F 27/36* (2006.01)
(52) U.S. Cl. .................................................. 336/84 M
(58) Field of Classification Search ................ 333/12, 333/202, 181–186; 336/84 R, 84 M; 174/125.1, 174/353, 391
See application file for complete search history.

(56) References Cited

U.S. PATENT DOCUMENTS

| 4,301,428 A | * | 11/1981 | Mayer ......................... 333/12 |
| 5,594,397 A | * | 1/1997 | Uchikoba et al. ........... 333/202 |
| 2003/0210104 A1 | * | 11/2003 | Nir et al. ...................... 333/12 |

FOREIGN PATENT DOCUMENTS

| FR | 2 665 809 | 2/1992 |
| JP | 11 186781 | 7/1999 |

OTHER PUBLICATIONS

Kondo, K. et al. "Conducted noise suppression effect up to 3 GHz by NiZn ferrite film plated at 90 degrees C directly onto printed circuit board", Journal of Applied Physics, vol. 93, No. 10, pp. 7130-7132, XP001165965 2003.

Deprot, S. et al. "Frequency response engineering of CoFeNiBSi microwires in the gigahertz range", Journal of Magnetism and Magnetic Materials, vol. 242-245, pp. 247-250 2002.

Shirakawa, K. et al. "Thin Film Cloth-Structured Indutor for Magnetic Integrated Circuit", IEEE Transactions on Magnetics, vol. 26, No. 5, pp. 2262-2264, XP000150520 1990.

* cited by examiner

*Primary Examiner*—Tuyen T. Nguyen
(74) *Attorney, Agent, or Firm*—Oblon, Spivak, McClelland, Maier & Neustadt, P.C.

(57) ABSTRACT

An electronic device furnished with magnetic screening having a peak of resonant magnetic losses. The screening includes at least one inductive winding constituted by at least one segment of metallic wire wound around at least one assembly of magnetic filaments.

17 Claims, 4 Drawing Sheets

ELECTRONIC DEVICE PROVIDED WITH A MAGNETIC SCREENING

TECHNICAL FIELD

The present invention concerns an electronic device provided with magnetic screening having a peak of resonant magnetic losses.

STATE OF THE PRIOR ART

The electronic devices of the known art may have their performance improved in a non-negligible manner by suppression of interference which perturbs their operation.

A first solution for obtaining such a result consists of screening the cables which transmit this interference, the connections which allow it to enter the said electronic devices, and the circuits which generate them, using the Faraday cage principle, that is, using a sheath or a casing which reflects the incident interferences towards the exterior. But in this solution, interferences emitted within the screening are then returned to it.

A second solution consists of attenuating the interference or definitively suppressing it. Recourse is then had to materials having peaks of magnetic losses which attenuate the electromagnetic emissions.

At frequencies from 10 kHz to 3 GHz, soft magnetic materials (ferrimagnetic oxides, ferromagnetic metals) are particularly effective. But forming such materials into a flexible form to enable easy conformation, by constituting a sheath or a casing, excludes the use of the usual techniques for implementation of these materials: sintering of ferromagnetic oxides, forging of ferromagnetic metals. The ferromagnetic materials used are then often constituted by an elastomer loaded with magnetic particles, thin iron strips, and wires, textiles, and knitted fabrics of metal.

To reach high frequencies (typically 1-1000 MHz), it is necessary to divide the characteristic geometrical dimensions (thickness, radius, etc.) of these materials so as not to be incommoded by their metallic character (skin effect). The large relative resistivity of ferromagnetic metals in the amorphous or nanocrystalline state is particularly favourable for such frequencies.

The use of such materials in the form of a fine powder is unfavourable because of the generally higher frequency character of these powders, due to their shape anisotropy. A large variety of commercial soft ferromagnetic materials having a very reduced dimension (threads, ribbons, thin layers, plates, powders, etc.) are particularly suitable for such applications.

Examples of the use of soft ferromagnetic materials having a very small dimension are given in the documents referenced [1] and [2] at the end of the description, in which ferromagnetic particles are used, incorporated in an elastomer. As described in the document [3], ferromagnetic filaments sheathed in glass have a permeability parallel to the filament when the sign of the magneto-elastic coupling coefficient (magnetostriction) is negative. They are then particularly attractive to the extent that:

the metallic diameter is small compared with the wavelength, their glass sheath confers electrical insulation, their preparation by the method of the known art named "Taylor Ulitovsky" is easy, their mechanical characteristics enable processing by technologies derived from textiles or from electrical cabling (wrapping, weaving, knitting, etc.).

They can therefore be used in filter cables, for example low-pass, as described in [4] and [5]. But in these documents, the position of the magnetic losses as a peak frequency is difficult and expensive to control to the extent that such control requires an alloy change, a parameter modification of the manufacturing process, or post-preparation treatments as described in the document [6].

Generally, the effectiveness of screening and filtering materials at a given frequency is essentially conditioned by their magnetic losses, that is, by their imaginary permeability. In effect, magnetic materials generally have an imaginary permeability which has a peak whose resonant frequency and bandwidth are linked to their characteristics. An adjustment of the resonant frequency is therefore possible by acting on the nature and characteristics of the material. On the other hand, the width of the absorption line is always greater than 500 MHz in ferromagnetic materials, which is troublesome when it is desired to filter a frequency band narrower than 500 MHz and to allow the rest of the signal to pass.

The invention has as its object to propose a solution to this problem by enabling an adjustment of the magnetic loss peak width, typically up to values of the order of 1 MHz, easy regulation of the resonant frequency, and a significant increase of the maximum level of magnetic losses, in the case where narrow bandwidths are sought with respect to conventional materials, the filtering then being more effective, or else, at a given efficiency, less filtering material being necessary.

SUMMARY OF THE INVENTION

The invention concerns an electronic device provided with magnetic screening having a peak of resonant magnetic losses, characterised in that this screening comprises at least one inductive winding constituted by at least one segment of metallic wire wound around at least one set of magnetic filaments.

The magnetic filaments may be sheathed in glass. The diameter of the metallic wire constituting the inductive winding may be comprised between 5 µm and 1 mm. The length of this wire may be comprised between 0,001 mm and 20 cm. The surface area of a turn may be comprised between 0.01 mm$^2$ and 1 cm$^2$. The number of turns may be comprised between 0.5 and 50. Each segment may comprise plural superposed windings of metallic wire. These windings may be formed in the opposite direction. The length over which a segment extends may be comprised between 0 and 50 mm. The distance between two neighbouring inductive segments may be comprised between 0 and 50 mm. At least two inductive segments of different characteristics may be combined. At least one textile thread without magnetic or electrical properties may be used to hold the filaments in place. A non-conductive thread which bears conductive segments may be used. A shaped conductive wire may be used, the fixation of the assembly of conductive wire+magnetic filaments being effected by embedding in a resin, the conductive wire being sectioned at desired places in order to produce the inductive segments. The assembly of conductive wire+magnetic filaments may be sectioned with grooves of depth equal to the wire diameter and for example over a length comprised between 0.1 and 50 mm.

In a first embodiment, the wire is wound on the core of a cable.

In a second embodiment, at least one layer of screening is disposed on a casing which generates at least one interference according to a polarisation. The screening wire is disposed in each layer so as to attenuate the interferences by placing it parallel to the magnetic field of an interference. The inductive segments may be periodically spaced, their distribution in each screening layer itself also being periodic. A bi-layer of screening may be used, a first layer dealing with a first polarisation and being transparent in the other, and a second layer treating a second polarisation, the screening wire of this second layer being regularly sectioned so as to cut off the reflector effect linked to the conductivity of the magnetic filaments.

DETAILED DESCRIPTION OF PREFERRED EMBODIMENTS

Figure 1:
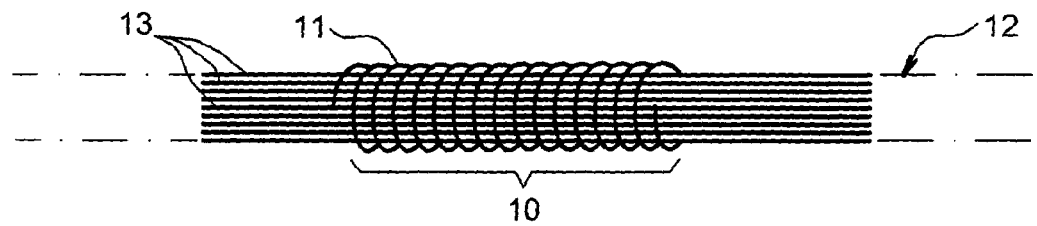
FIG. 1 shows the device of the invention.

In the device of the invention such as shown in FIG. 1, at least one segment 10 of metallic wire constituting screening is wound, for example by a wrapping technique, on a wire 12 constituted by an assembly of magnetic filaments 13. Several segments of this type can therefore be wound, for example in a regular manner, on the wire 12.

The magnetic filaments 13 may be ferromagnetic filaments sheathed in glass, because of the previously cited advantages. Such ferromagnetic filaments, whose alloy is chosen so as to have a high permeability parallel to the wire 12, constitute the basic magnetic material. The design rules for such filaments are given in the documents [7] and [8].

The segments 10 play the part of resonant inductive windings. Their electrical and geometrical characteristics, conductivity, diameter, length, and winding pitch regulate the position in frequency and the width of the peak of magnetic losses.

The conductivity of the wire 11 acts, for example, on the resistance of the inductive element: the greater the conductivity of this wire, the narrower the peak. The resistivity (inverse of conductivity) varies strongly as a function of the nature of the alloy used. Currently, wires are found having a resistance per unit length of:

535.5 ohm/m (for example Isa-Chrom 80, diameter 50 µm, of the IsabellenHuette Heusler GmbH Company),
169 Ohm/m (for example Resistherm, diameter 50 µm, of the IsabellenHuette Heusler GmbH Company),
40 Ohm/cm (for example, 99.6% pure nickel, diameter 50 µm, of the IsabellenHuette Heusler GmbH Company),
3.57 Ohm/cm (for example E-Kupfer copper, of 80 µm diameter, of the of the IsabellenHuette Heusler GmbH Company).

The diameter of the wire 11 and the area of turns which it constitutes (number of turns×surface) act on the inductance of the winding: the finer the wire and the greater the area of the turns, the more the resonant frequency of the winding decreases.

The wire diameter may for example be comprised between 5 µm and 1 mm. The length of wire 11 wound in each segment 10 may be comprised between 0.001 mm and 20 cm. The surface of a turn may be comprised between 0.01 mm² and 1 cm². The number of turns of each segment 10 may be comprised between 0.5 and 50. Plural superposed windings, possibly made in the opposite direction, may constitute each segment 10. The length over which the winding of each segment extends may be comprised between 0 and 50 mm. The distance between two neighbouring inductive segments 10 may be comprised between 0 (quasi-contiguous segments) and 50 mm. The different inductive segments 10 may have different characteristics so as to create a spectrum of magnetic losses with two or more peaks of imaginary permeability.

The technique used for constituting the windings of the conductive segments 10 around the assembly of magnetic filaments 13 is related to the technique of wrapping, which is a finishing technique much used for textile threads. The parameters of wrapping (number of wrapping wires, sense of wrapping (S or Z), and pitch of wrapping on the wire, are variables which enable inductive segments 10 to be realised with different properties. Wrapping with, for example, two wires turning in contrary directions enables the inductive effect of the winding to be augmented without extending its length and modifies the couplings of the inductive winding with the electric field parallel to the winding. The function of keeping the filaments 13 in place may be performed by one or more textile threads without magnetic or electrical properties. A considerable torsion of the filaments 13 may be added so as to increase the mechanical strength of the wire 12 (if a filament is cut, it does not reduce the overall strength of the wire because this is "jammed" by the torsion).

Figure 2:
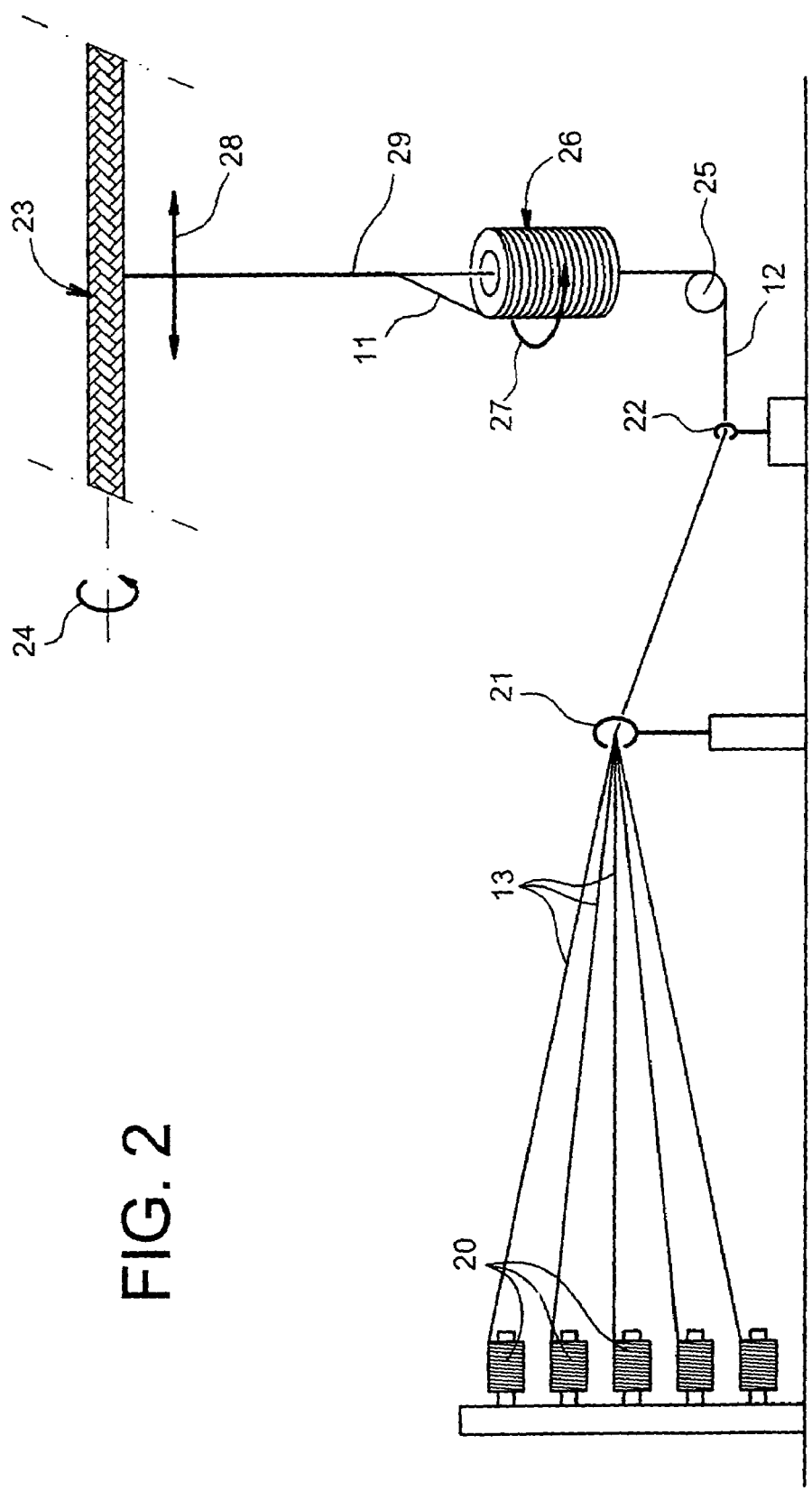
FIG. 2 shows a wrapping installation.

In the wrapping installation, shown in FIG. 2, the wire 12 is obtained by assembling plural magnetic filaments 13 coming from bobbins 20 after passage through two bushings 21 and 22. A receiving bobbin 23 having a direction of rotation 24 combined with a travelling comb (not shown), having a transverse movement of displacement 28, enables storage of a wire 29 constituted by the said wire 12 after passage over a rotating wheel 25 on which has been wound a wire 11 coming from a wrapping bobbin 26 in rotation 27.

The conductive segments 10 may be formed before wrapping, for example by constituting a non-conducting thread beforehand which bears these conductive segments 10. This may for example be a textile thread on which a conductive paint has been disposed, this thread acting to wrap the filaments 13. The segments 10 then act to keep the filaments 13 in place.

Wrapping of the filaments 13 may also be performed using a conductive wire 11, shaping the wire 12 thus obtained, ensuring the fixation of the assembly for example by embedding it in a resin, and sectioning the conductive wire at the desired places in order to realise the inductive segments 10.

To section the assembly of conductive wire 11+magnetic filaments 13, grooves may be made, of length comprised between 0.1 and 50 mm with lengths of magnetic filaments comprised between 0.1 and 50 mm.

Figure 3:
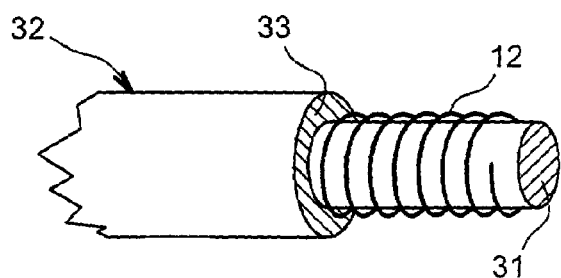
FIG. 3 shows a first embodiment of the device according to the invention, in the form of a screened cable.

In a first embodiment of the invention, the wire 12, obtained as described above, is shaped as the wrapping or filtering material by winding it on a core of a cable 32, as shown in FIG. 3. Following the specification of attenuation of this cable 32 according to the frequency bands used, a screening wire 12 is produced whose conductive segments 10 respond to this specification. The magnetic field generated by such a cable 32 being orthoradial, the good utilisation geometry of the screening wire 12 consists of turning the screening wire around the core of the cable 32 so as to optimise the effect of the absorption of the field by the wire 12. This wire 12 is therefore wound around the internal structure 31 of this cable 32, which also comprises an external layer 33.

Figure 4:
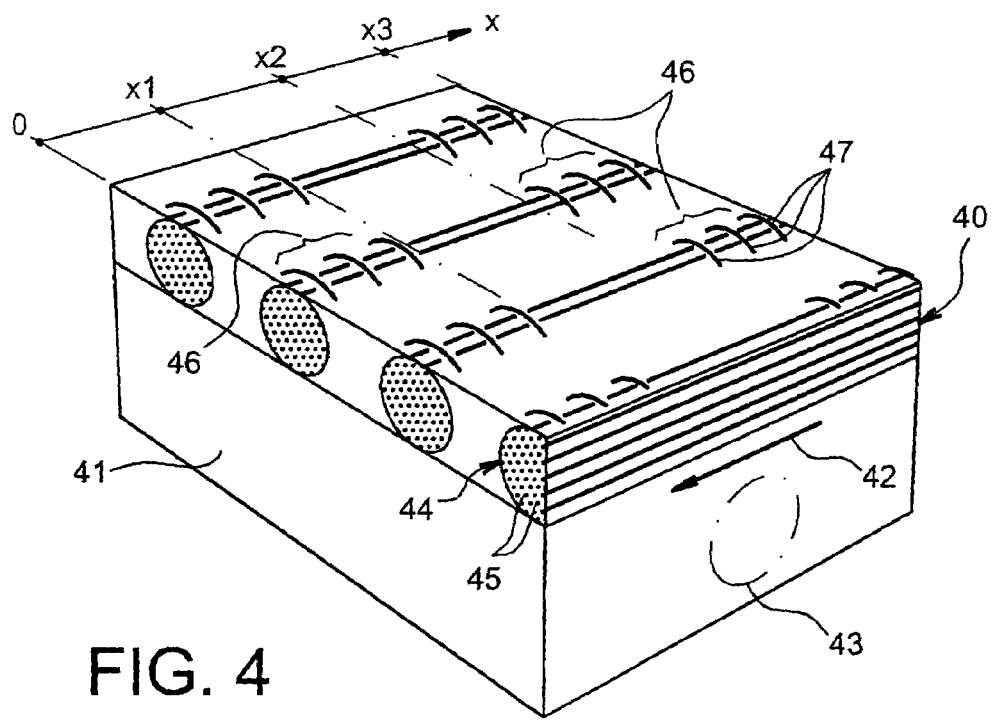
FIGS. 4, 5A and 5B show a second embodiment of the device according to the invention.

In a second embodiment, illustrated in FIG. 4, a screening layer 40 according to the invention is placed on a casing 41 undergoing an interference in a direction 42 in a zone 43, to screen the latter by enabling the interference to be filtered. The screening wires 44, constituted by magnetic filaments 45, are disposed parallel to the magnetic field of the interference so as to attenuate it. Eight inductive segments 46, each of 3 turns 47, are wound around these screening wires 44. The density of these inductive segments 46, as shown, is low so as to preserve the clarity of the illustration. But it may reach greater values (for example, by jointed patterns) in practice. As an example, in FIG. 4, the inductive segments 46 are periodically spaced on the screening wire 44, and their distribution in the screening layer 40 is also periodic. The segments 46 are placed at identical abscissas x (parallel to the wire).

Figure 5A:
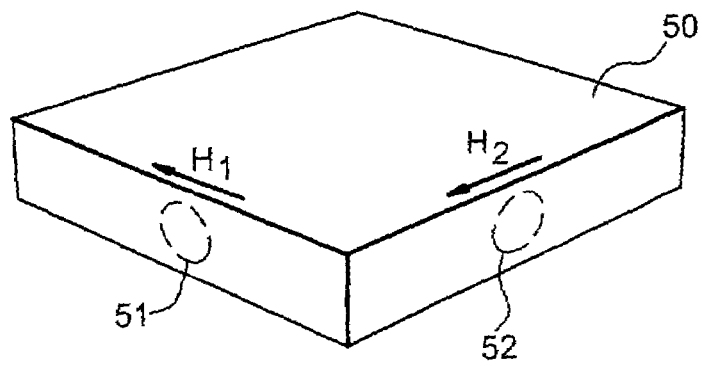
Figure 5B:
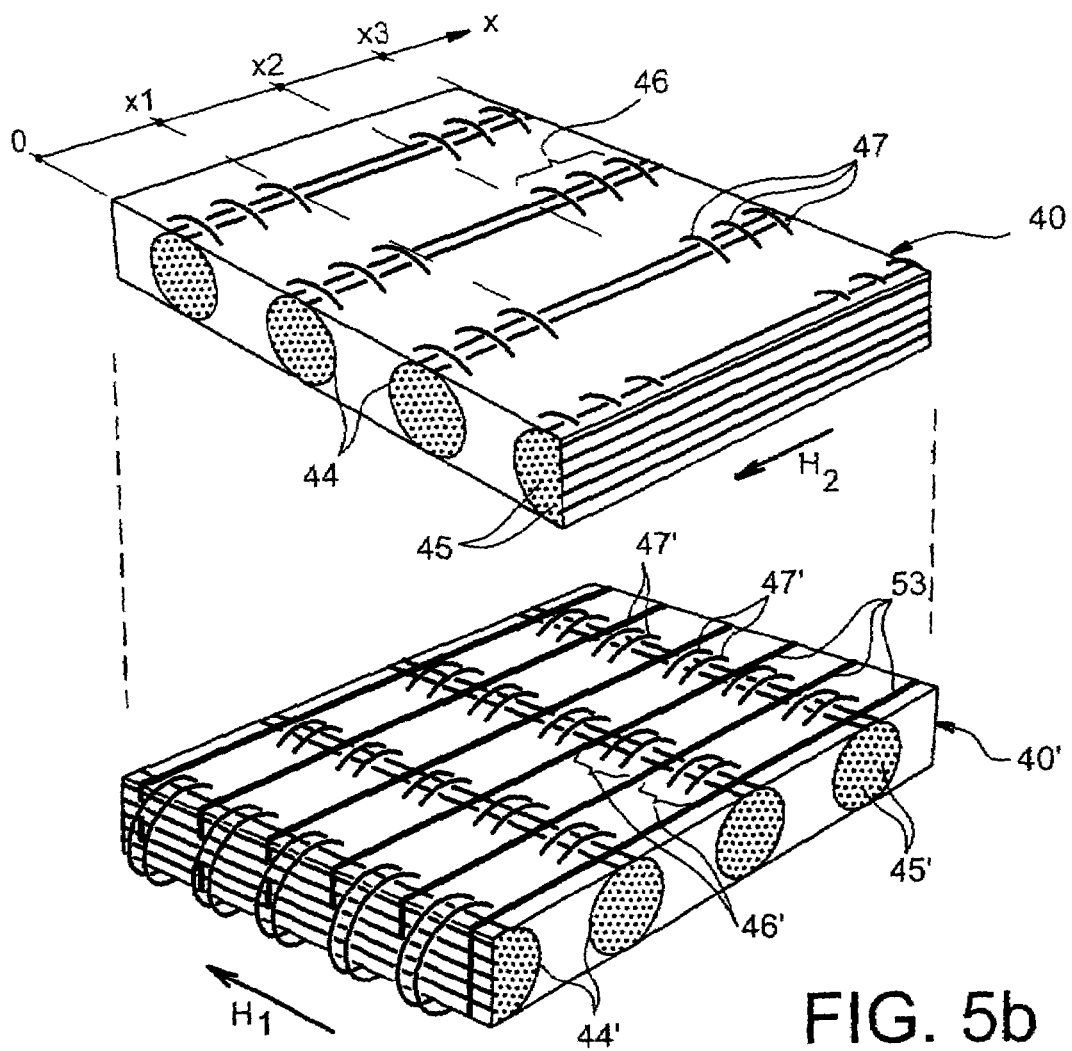

To increase the efficiency of the screening, plural layers of screening may be superposed. So, as illustrated in FIG. 5, a bi-layer screening may be used, as shown in FIG. 5B, to be placed on a casing 50 shown in FIG. 5A, in which the interference generated comprises components in the two polarisations of the magnetic field. The zones 51 and 52 are respectively zones which are subject to interference following the polarisation H1 and following the polarization H2. Each layer of screening deals with one polarization and is transparent in the other, and the other layer deals with the other polarisation. To obtain a transparent lower layer 40', the screening wires 44' of this layer are regularly sectioned, for example by means of groove 53, to cut off the reflector effect linked to the conductivity of the magnetic filaments 45'. Such cuts may be realised at the same time as the cuts which are made in the conductive wrapping wire used to produce the inductive segments 46'. Such grooves 53 enable the transparency of the second layer 40' to be ensured with respect to the electric field associated with the polarization H2.

Windings formed around magnetic materials have already been proposed, for example in the document [9].

The conductive character along the axis of the ferromagnetic filaments changes the microwave frequency behaviour. As a result, there is an absence of resonant interference on the permittivity. The possibilities of engineering the frequency response (bandwidth, position of absorption peak) offered by the conductive segments (wrapping pitch, number of turns, etc.) enable realising absorption in the two polarisations over the same frequency band.

EMBODIMENT EXAMPLES

Figure 6:
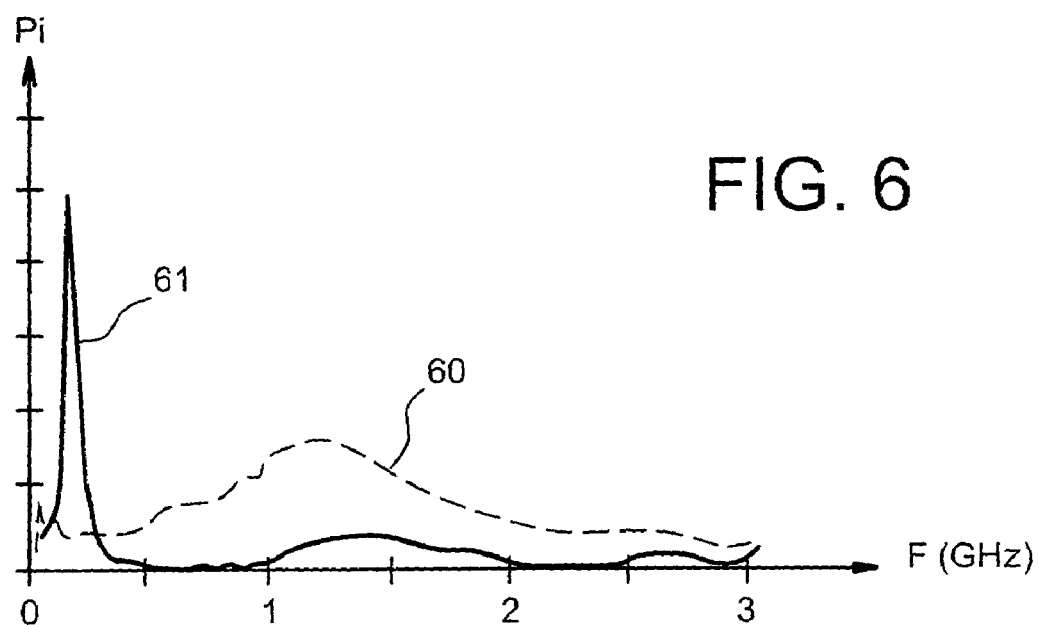
FIGS. 6 and 7 show curves of imaginary permeability as a function of frequency for two different examples of the device according to the invention.
Figure 7:
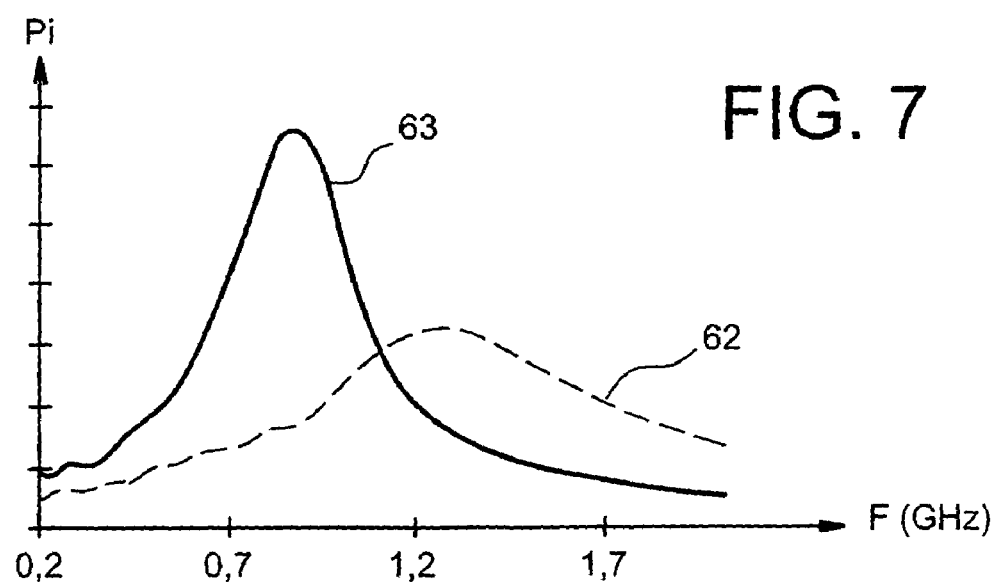

In a first embodiment example, a set of ferromagnetic filaments is used, sheathed in glass by the Taylor Ulistovsky process. These filaments are made of a soft commercial alloy with a diameter of 4 micrometers and the glass sheath 2 micrometers thick. As shown in FIG. 1, a copper wire is wound around the filaments 13 to form a sample whose permeability is measured by a microwave characterisation method. The copper wire is an enamelled copper wire 50 μm in diameter, which is periodically sectioned in order to form segments of conductive wire with a period of 6.2 mm, the length of the groove then formed being 0.6 mm. The area of the turns is 1 mm$^2$. The length of these segments is 80 mm. The wrapping pitch is 0.4 mm. FIG. 6 shows a curve 60 of imaginary permeability Pi of such a sample without conductive segments and a curve 61 of magnetic permeability Pi of such a sample with conductive segments 61 according to the invention. The position of the resonant peak of permeability Pi has moved from 1.2 GHz to 0.2 GHz due to the inductive segments, while the bandwidth Δf at half height has moved from 768 MHz to 68 MHz. If the ratio f/Δf is defined as the selectivity of the filter, this has been multiplied by 2, since it has passed from 1.5 to 3.

In a second embodiment example, to show how easily the screening according to the invention may be used to filter a frequency band, a sample prepared as previously is used, but with lengths of inductive segments of 20 mm and a wrapping pitch of 1.5 mm. The position of the peak of maximum losses has moved from 1.2 GHz (curve 62 without inductive segments) to 0.8 GHz (curve 63 with inductive segments) due to the inductive segments, while the bandwidth at mid-height has gone from 768 MHz to 400 MHz, and the selectivity of the filter has gone from 1.5 to 2.

REFERENCES

[1] Documentation Tokin http://www.nec-tokin.com
[2] EP 1143458
[3] "High frequency losses of ferromagnetic wires near the gyromagnetic resonance". S. Deprot, A.-L. Adenot, F. Bertin, E. Herve and O. Acher (IEEE Trans. Magn, 37, 2404, 2001)
[4] WO 00/68959
[5] WO 00/31753
[6] "Frequency response engineering of CoFeNiBSi microwires in the GHz range". S. Deprot, A.-L. Adenot, F. Bertin, and O. Acher (J. Magn. Mater. 242, 247, 2002).
[7] "High frequency permeability of thin amorphous wires with various anisotropic fields". M. J. Malliavin, O. Acher, C. Boscher, F. Bertin and V. S. Larin (J. Magn. Magn. Mater. 196-197, 420, 1999)
[8] "Parallel permeability of ferromagnetic wires up to GHz frequencies". O. Acher, A. L. Adenot, S. Depcot. (J. Magn. Magn. Mater. 249, 264, 2002)
[9] "Resonance phenomena in chiral and chiro-ferrite one-dimensional media in the microwave band". G. A. Kraftmakher, Yu K. Yazantsev. (J. Comm. Tech. Elec. 44, 1393-1402, 1999).

The invention claimed is:

1. An electronic device comprising:
   a magnetic screening wire having a peak of resonant magnetic losses, said magnetic screening wire including,
   at least one assembly of magnetic filaments, and
   at least one inductive winding including at least one segment of metallic wire wound around said at least one assembly of magnetic filaments.

2. A device according to claim 1, wherein the magnetic filaments are sheathed in glass.

3. A device according to claim 1, wherein a diameter of the metallic wire is comprised between 5 μm and 1 mm, a length of the wire is comprised between 0.001 mm and 20 cm, a surface of a turn is comprised between 0.01 mm$_2$ and 1 cm$_2$, and a number of turns is comprised between 0.5 and 50.

4. A device according to claim 1, wherein each segment comprises plural superposed windings of metallic wire.

5. A device according to claim 4, wherein the plural windings are performed in opposite directions.

6. A device according to claim 1, wherein each segment has a length comprised between 0 and 50 mm, a distance between two neighboring segments being comprised between 0 and 50 mm.

7. A device according to claim 1, wherein at least two inductive segments of different characteristics are combined.

8. A device according to claim 1, comprising at least one textile thread without magnetic or electrical properties to ensure keeping the filaments in place.

9. A device according to claim 1, comprising a non-conductive wire that carries the conductive segments.

10. A device according to claim 1, wherein conductive wire is conformed, a fixation of the assembly of conductive wire and magnetic filaments being effected by embedding in a resin and sectioning the conductive wire at desired places to produce inductive segments.

11. A device according to claim 10, wherein the assembly of conductive wire and magnetic filaments is sectioned with grooves.

12. A device according to claim 11, wherein the grooves have a depth equal to the diameter of the wire and over a length between 0.1 and 50 mm.

13. A device according to claim 1, wherein the magnetic screening wire is wound on a core of a cable.

14. A device according to claim 1, wherein at least one layer of the magnetic screening wire is disposed on a casing that generates at least one interference according to a polarization, in which the magnetic screening wire is structured in each layer so as to attenuate an interference by placing the magnetic screening wire parallel to the magnetic field of the interference.

15. A device according to claim 14, further comprising:
inductive segments of the at least one inductive winding spaced periodically on the assembly of magnetic filaments, a distribution of the inductive segments being periodic.

16. A device according to claim 14 comprising first and second screening layers.

17. A device according to claim 16, wherein the first screening layer deals with a first polarization and is transparent in the other, and the second screening layer deals with a second polarization, the screening wire of the second layer being regularly sectioned so as to cut off a reflector effect linked to conductivity of the magnetic filaments.

* * * * *